US010363540B2

(12) United States Patent
Koiwasaki et al.

(10) Patent No.: US 10,363,540 B2
(45) Date of Patent: Jul. 30, 2019

(54) PRODUCTION APPARATUS AND PRODUCTION METHOD FOR FINE PARTICLES

(71) Applicant: Panasonic Intellectual Property Management Co., Ltd., Osaka (JP)

(72) Inventors: Takeshi Koiwasaki, Osaka (JP); Hisao Nagai, Osaka (JP); Takafumi Okuma, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 337 days.

(21) Appl. No.: 15/430,439

(22) Filed: Feb. 10, 2017

(65) Prior Publication Data
US 2017/0274344 A1 Sep. 28, 2017

(30) Foreign Application Priority Data

Mar. 25, 2016 (JP) .................................. 2016-061967

(51) Int. Cl.
*B01J 19/08* (2006.01)
*H01J 37/32* (2006.01)

(52) U.S. Cl.
CPC ....... *B01J 19/088* (2013.01); *H01J 37/32055* (2013.01); *H01J 37/32458* (2013.01); *H01J 37/32825* (2013.01); *B01J 2219/083* (2013.01); *B01J 2219/0809* (2013.01); *B01J 2219/0813* (2013.01); *B01J 2219/0828* (2013.01); *B01J 2219/0839* (2013.01); *B01J 2219/0875* (2013.01); *B01J 2219/0886* (2013.01); *B01J 2219/0898* (2013.01); *H01J 2237/339* (2013.01)

(58) Field of Classification Search
None
See application file for complete search history.

(56) References Cited

U.S. PATENT DOCUMENTS

| 5,244,488 A | 9/1993 | Sato et al. |
|---|---|---|
| 6,358,375 B1 | 3/2002 | Schwob |
| 2008/0257723 A1 | 10/2008 | Yumoto et al. |
| 2008/0277270 A1 | 11/2008 | Biberger et al. |
| 2015/0135514 A1 | 5/2015 | Sasaki et al. |

FOREIGN PATENT DOCUMENTS

| JP | 2-277729 | 11/1990 |
|---|---|---|
| JP | 2002-029718 A | 1/2002 |
| JP | 2002-504057 A | 2/2002 |
| JP | 2004-263257 | 9/2004 |
| JP | 2006-111921 | 4/2006 |
| JP | 2010-526662 | 8/2010 |
| JP | 2015-099839 | 5/2015 |

*Primary Examiner* — Kishor Mayekar
(74) *Attorney, Agent, or Firm* — Panasonic IP Management; Kerry S. Culpepper

(57) ABSTRACT

A production apparatus for fine particles includes a vacuum chamber, a material feeding device connected to the vacuum chamber and feeding material particles from a material feeding port into the vacuum chamber, electrodes arranged in the vacuum chamber for generating plasma and a fine particle collection device connected to the vacuum chamber and collecting fine particles. The fine particles are produced from the material by generating electric discharge inside the vacuum chamber. The apparatus includes an inner chamber which forms an outside space with respect to the vacuum chamber installed between a wall of the vacuum chamber and a plasma generation region and gas supply pipes which supply a gas to the outside space between the wall of the vacuum chamber and a wall of the inner chamber.

11 Claims, 4 Drawing Sheets

US 10,363,540 B2

PRODUCTION APPARATUS AND PRODUCTION METHOD FOR FINE PARTICLES

TECHNICAL FIELD

The technical field relates to a production apparatus and a production method for fine particles used for, for example, an electrode material of a lithium-ion battery, a coating material such as on a film material of food packaging or an ink raw material used for electric apparatus wiring, etc.

BACKGROUND

In recent years, fine particles in nanometer order are considered for application to various devices. For example, metal fine particles of nickel are used for a ceramic capacitor at present, and fine particles with a particle diameter of 200 nanometers or less having good dispersibility are considered to be used for a next generation ceramic capacitor.

Furthermore, fine particles of silicon monoxide (SiOx: x=1 to 1.6) having a lower oxygen content than silicon, dioxide are utilized as an antireflection film of an optical lens or a deposition material of a gas-barrier film for food packaging. Recently, application of the fine particles to an anode material of a lithium-ion secondary battery is expected.

As a common method of producing fine particles in nanometer order, there are a method of introducing a bulk material as a raw material together with beads such as ceramic beads and zirconia beads, and miniaturizing the material into particles by mechanical crushing, a method of melting and evaporating a material and spraying the material to air or water to obtain fine particles and a method of chemically obtaining fine particles by electrolysis or reduction, etc. Among them, a method of producing fine particles in a vapor by using thermal plasma (approximately 10000° C.) such as high-frequency plasma or arc plasma is extremely useful because the produced fine particles are excellent in dispersibility with less contamination and composite fine particles formed of plural kinds of materials can be easily composed (for example, refer to JP-A 2004-263257 (Patent Document 1)).

FIG. 4 shoves a schematic cross-sectional view of a production apparatus for fine particles utilizing thermal plasma according to a related art example 1.

A powder generator 101 has a hollow body, which is roughly divided into a fine mist introduction part 201, a fine mist reservoir part 202 and a reaction part 203. The fine mist introduction part 201 is provided to be directed to the fine mist reservoir part 202 on a side in a lower part of the powder generator 101, and the cylindrical reaction part 203 continues above the fine mist reservoir part 202. A powder collection part 204 includes a filter member thereinside, for example, a bag filter 205 for separating fine particles and the gas. A suction machine 206 is provided to suck inside the powder generator 101 through a duct 207, the bag filter 205 inside the powder collection part 204 and a duct 208, discharging the gas passing through the bag filter 205 to the outside. The reaction part 203 includes a group of electrodes 210, and these electrodes 210 are connected one by one to secondary-side terminals of respective phases in a polyphase AC converter 211 which converts three-phase alternating current supplied from a commercial power supply into polyphase alternating current through plural single-phase transformers. Moreover, tip end portions of the electrodes 210 are positioned around an axial center of the reaction part 203 at equal intervals, which are arranged so that phase differences between adjacent tip end portions are equal to one another, thereby forming a plasma 212 among the electrodes 210. Fine mist is allowed to pass through the plasma 212 to generate fine particles, which can be collected by the bag filter 205 of the powder collection part 204.

SUMMARY

In the case where fine particles are produced by using the above related-art fine particle production apparatus (see FIG. 4), control of the flow is difficult as a space exists between the plasma 212 and an apparatus wall and the gas flows in one direction. Therefore, dispersion of generated fine particles and reinput to the plasma occur, which reduces a collection amount and generates thermal plasma, as a result, conversion efficiency of inputted electric energy into heat is reduced and production efficiency of fine particles is deteriorated.

In view of the above problems, as well as other concerns, an object of the present disclosure is to provide a production apparatus and a production method for fine particles capable of increasing the production of fine particles and producing fine particles at low cost by improving the collection amount and the efficiency of energy utilized for processing with respect to the inputted power energy.

A product ion apparatus for fine particles according to an aspect of the present disclosure has a vacuum chamber, a material feeding device connected to the vacuum chamber and feeding material particles from a material feeding port into the vacuum chamber, electrodes arranged in the vacuum chamber for generating plasma in a plasma generation region in the vacuum chamber, and a collection device connected to the vacuum chamber and collecting fine particles discharged from the vacuum chamber, which produces the fine particles from the material supplied from the material feeding device by the plasma generated inside the vacuum chamber, the apparatus includes an inner chamber which forms an outside space with respect to a wall of the vacuum chamber installed between the wall of the vacuum chamber and the plasma generation region and gas supply pipes which supply a gas to the outside space between the wall of the vacuum chamber and a wall of the inner chamber.

A production method for fine particles according to another aspect of the present disclosure includes the steps of supplying a gas to a vacuum chamber and supplying the gas into an outside space between a wall of the vacuum chamber and a wall of an inner chamber which is arranged between the wall of the vacuum chamber and a plasma generation region, generating thermal plasma in the plasma generation region in a space inside the inner chamber by electrodes installed in the vacuum chamber, feeding material particles to the vacuum chamber to be evaporated or gasified when the fed material particles passes through the generation region of the generated thermal plasma to thereby obtain a material gas and cooling the material gas rapidly at a moment when the material gas passes through the region of thermal plasma to thereby generate fine particles.

According to the above aspects of the present disclosure, the outside space is provided between the wall of the vacuum chamber and the inner chamber and the gas is supplied to the outside space between the wall of the vacuum chamber and the inner chamber to thereby reduce a space around plasma, which facilitates control of the flow of processed fine particles, therefore, energy necessary for evaporating the material by thermal plasma can be reduced. Accordingly, efficiency of evaporating the material by thermal plasma is increased and a large quantity of material can be processed by improving a collection amount and efficiency of energy utilized for processing with respect to the inputted power energy, therefore, it is possible to provide a production apparatus and a production method for fine particles capable of increasing the production of fine particles and producing fine particles at low cost.

DESCRIPTION OF EMBODIMENTS

Hereinafter, embodiments of the present disclosure will be explained in detail with reference to the drawings.

First Embodiment

Figure 1:
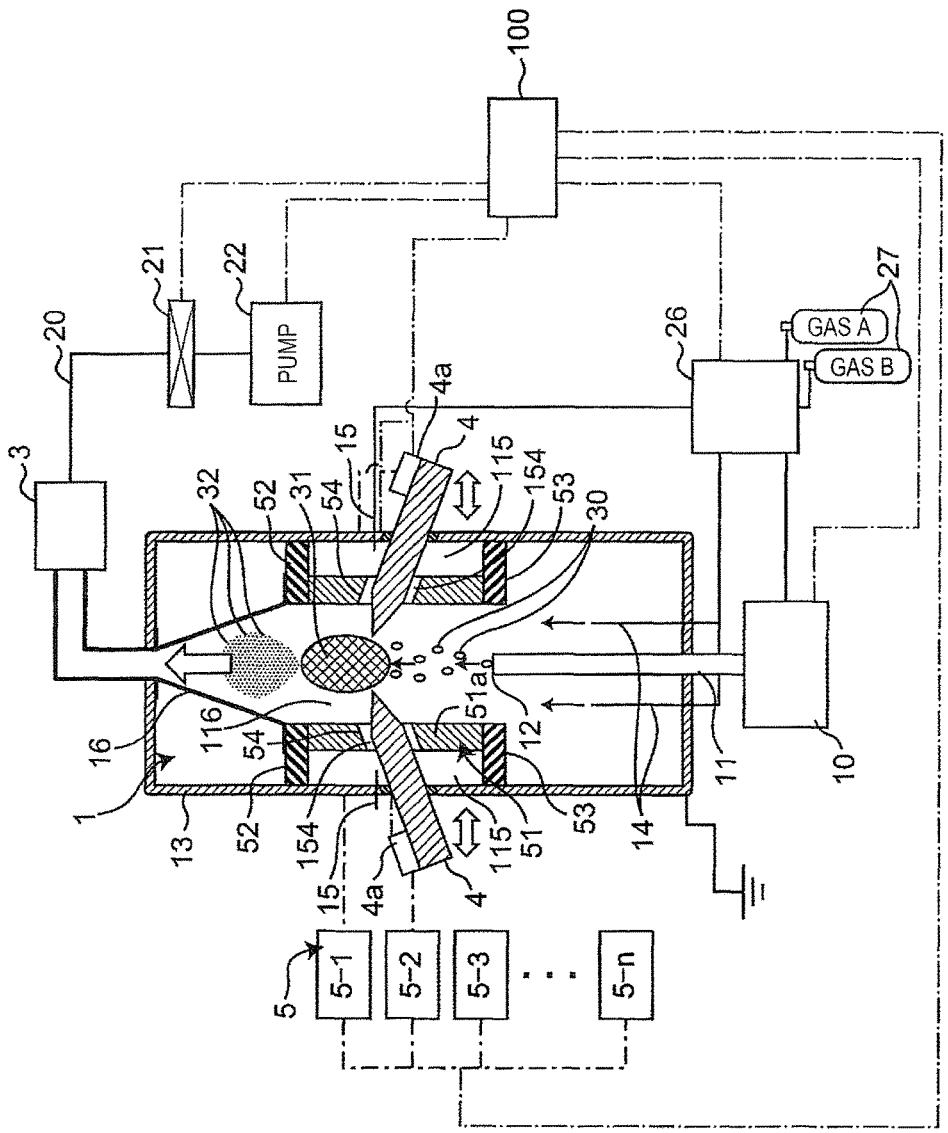
FIG. 1 is a schematic vertical cross-sectional view of a production apparatus for fine particles according to a first embodiment of the present disclosure.
Figure 2:
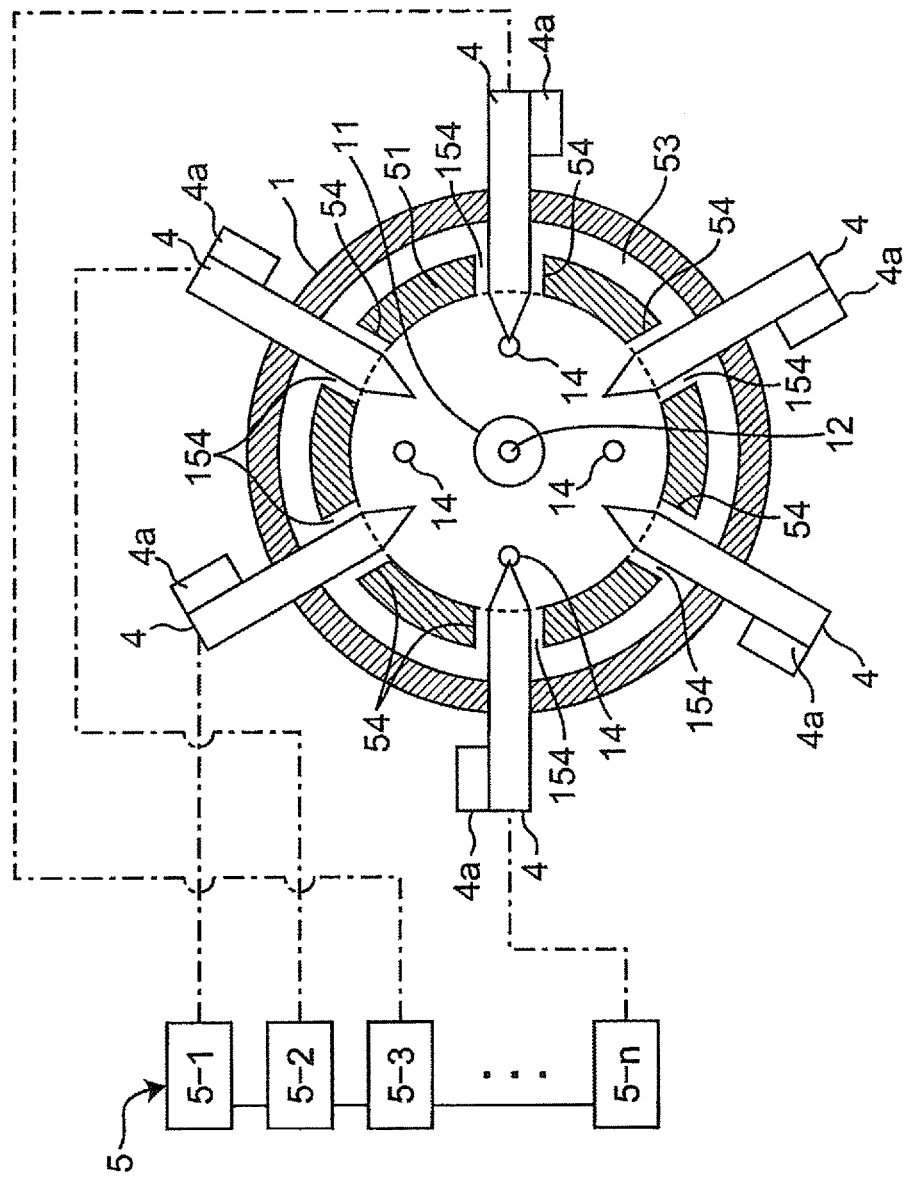
FIG. 2 is a plan view of a schematic cross section of the production, apparatus for fine particles according to the first embodiment of the present disclosure.
Figure 3:
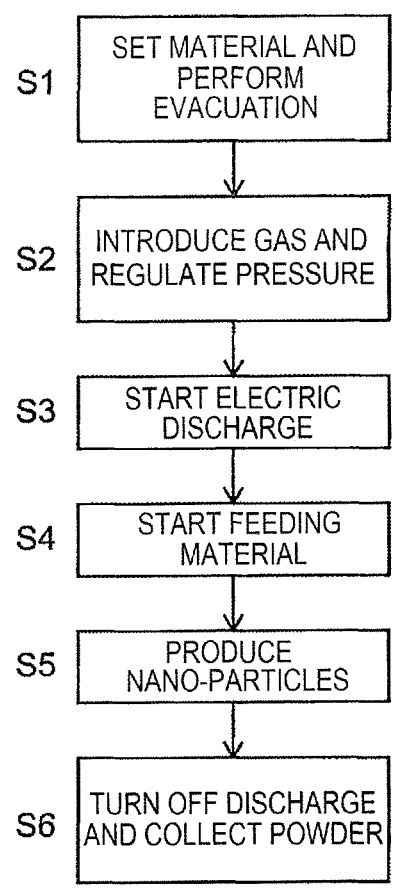
FIG. 3 is a process flow diagram according to the first embodiment of the present disclosure.
Figure 4:
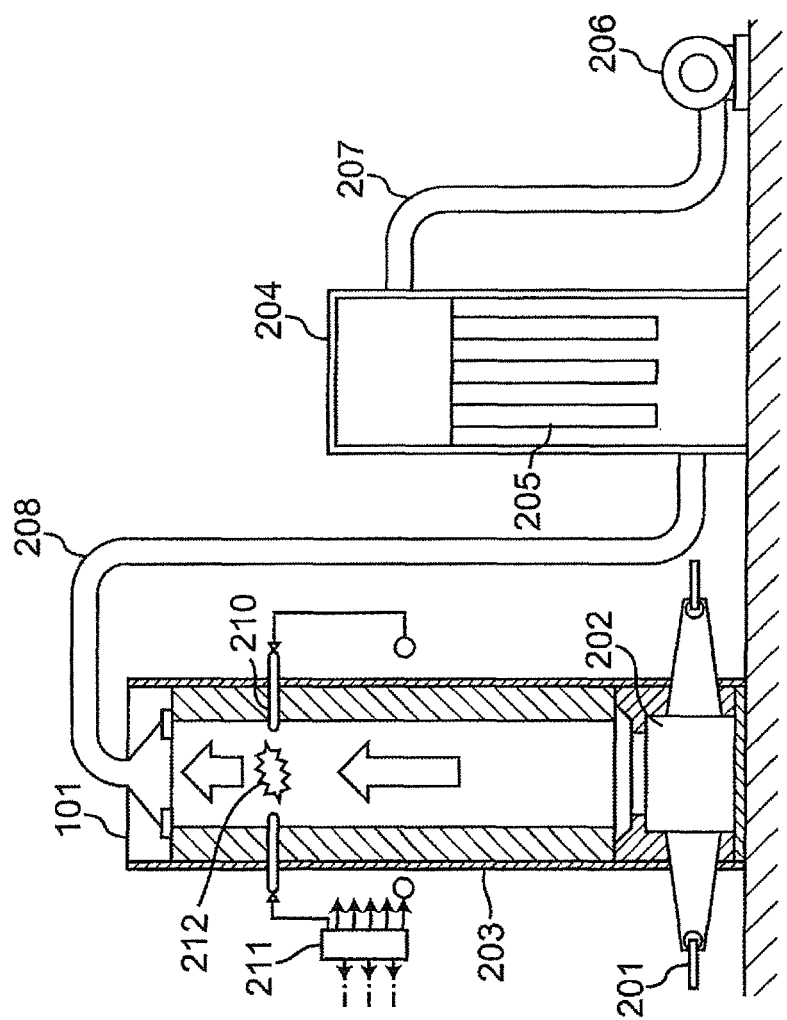
FIG. 4 a schematic cross-sectional view of a production apparatus for fine particles according to a related art example 1.

FIG. 1 shows a schematic vertical cross-sectional view of a production apparatus for fine particles according to a first embodiment. FIG. 2 shows a schematic cross-sectional plan view of the production apparatus for fine particles according to the first embodiment in a state of being transversely cut at an electrode part. FIG. 3 shows a process flow according to the first embodiment. An example of producing fine particles of silicon in nanometer order will be explained with reference to FIG. 1 to FIG. 3.

A production apparatus for fine particles according to the first embodiment includes at least a reaction chamber 1 as an example of a vacuum, chamber, a material feeding device 10, electrodes for generating arc discharge such as, for example, a plurality of electrodes 4 and a fine particle collection section 3 as an example of a collection device which collects generated fine particles. The reaction chamber 1 is formed by being surrounded by a cylindrical reaction chamber wall 13 which is grounded. The material feeding device 10 is arranged below a bottom part of the reaction chamber 1, feeding the material into the reaction chamber 1. The fine particle collection section 3 is arranged to connect to an upper end of the reaction chamber 1, and be evacuated by a circulation pump 22 through a pipe 20 and a pressure regulating valve 21 and collect fine particles generated in the reaction chamber 1. The plurality of electrodes 4 are arranged at side parts in the center of the reaction chamber 1 at intervals so that tip ends penetrate from the outside to the inside toward an inner space. Respective electrodes 4 and the reaction chamber wall 13 are insulated. In such production apparatus for fine particles, an arc discharge (plasma) 31 is generated in an arc discharge generation region (plasma generation region) inside the reaction chamber 1, and fine particles are produced from the material fed from the material feeding device 10 by the generated plasma.

n-pieces of AC power sources 5 (5-1, 5-2, 5-3, . . . 5-n) supplying power in different phases are respectively connected to the plurality of electrodes 4, which can respectively apply an AC voltage of 60 Hz in which the phase is shifted by, for example, 60 degrees. Respective electrodes 4 are movable electrodes which move back and forth independently in radial directions with respect to the center of the reaction chamber 1 by electrode driving devices 4a formed by motors, etc.

More specifically, the production apparatus for fine particles according to the first embodiment is provided with a material feeding pipe 11 connecting the material feeding device 10 to the reaction chamber 1 and gas supply pipes 14 and 15 respectively supplying a gas into the reaction chamber 1 so as to control the flow of the inputted material and the generated fine particles.

The material feeding device 10 is connected to the reaction chamber 1 through the material feeding pipe 11 and supplies the material from the material feeding device 10 into the reaction chamber 1 from the bottom side of the reaction chamber 1. The material feeding pipe 11 is provided to stand from the bottom part of the material feeding device 10 to the vicinity of the central part upward in a vertical direction, having a material feeding port 12 at an upper end. A plurality of lower-side gas supply pipes 14 are arranged from the bottom part of the material feeding device 10 in the vicinity of the material feeding pipe 11 along a longitudinal direction of the material feeding pipe 11 (namely, along the vertical direction), which can supply the gas from the lower side of the material feeding port 12 in the vertical direction upward in the vertical direction. The material feeding pipe 11 and the material feeding port 12 are arranged on a lower side than central positions of the plural electrodes 4 in the vertical direction. In particular, the material feeding port 12 at the upper end of the material feeding pipe 11 is arranged so as to be positioned in a lower part than a region where the arc discharge 31 is generated.

In the vicinity of the region where the arc discharge 31 is generated near the tip ends of the plural electrodes 4, for example, a cylindrical inner chamber 51 is formed inside the reaction chamber 1 so that an outside space 115 is formed between the inner chamber 51 and the reaction chamber wall 13. As an example, the region where the arc discharge 31 is generated is included in an inside space 116 inside the inner chamber 51. A cylindrical wall 51a of the inner chamber 51 is connected to the reaction chamber wall 13 through ring-shaped plates 52 and 53 as examples of thermal insulation and electric insulation members to be thermally insulated and electrically insulated from the reaction chamber wall 13 at an upper end portion and a lower end portion of the wall 51a. The wall 51a of the inner chamber 51 has electrode through holes 54 for respective electrodes 4, and the electrodes 4 and inner peripheral surfaces of the through holes 54 in the wall 51a of the inner chamber 51 are arranged with gaps 154. The plural upper-side gas supply pipes 15 are arranged transversely toward the center between the wall 51a of the inner chamber 51 and the reaction chamber wall 13, which can supply the gas toward the center. As an example, tip end openings of the gas supply pipes 15 are arranged toward the through holes 54 between the wall 51a of the inner chamber 51 and the reaction wall chamber 13. The arrangement is for allowing a pressure in the outside space 115 of the inner chamber 51 between the wall 51a of the inner chamber 51 and the reaction chamber wall 13 to be higher than a pressure in the inside space 116 of the inner chamber 51 when the gas is supplied from the gas supply pipes 15 to thereby introduce the gas to the inside of the inner chamber 51 from the gaps 154 between, the through holes 54 for the electrode 4 in the wall 51a of the inner chamber 51 and the electrodes 4. Furthermore, a pipe 16 connecting the inner chamber 51 to the fine particle collection section 3 and having a conical-shaped tapered portion is arranged in an upper part of the reaction chamber 1.

The lower-side gas supply pipe 14 and the upper-side gas supply pipe 15 are connected to plural gas supply devices 27 through a flow-rate regulator 26. Therefore, gases for generating arc discharge (for generating plasma) can be supplied to the material feeding device 10, the lower-side gas supply pipe 14 and the upper-side gas supply pipe 15 from the plural gas supply devices 27 through the flow-rate regulator 26 respectively while regulating the flow rate.

The controller 100 controls the drive of the electrode driving devices 4a, the AC power sources 5 (5-1, 5-2, 5-3, . . . , 5-n), the material feeding device 10, the pressure regulating valve 21, the circulation pump 22 and the flow-rate regulator 26 respectively to control production operations of the production apparatus for fine particles.

Hereinafter, production operations of the production apparatus for fine particles will be explained by following a process flow of FIG. 3. The production operations of the production apparatus for fine particles, in other words, a production method for fine particles includes six steps which are (Step S1) setting material and performing evacuation, (Step S2) introducing gas and regulating pressure, (Step S3) starting electric discharge, (Step S4) starting feeding material, (Step S5) producing fine particles (nano-particles) and (Step S6) turning off electric discharge and collecting fine particles. The following operations can be automatically performed by control operations of the controller 100 except the material setting and so on.

(Step S1) A material is Set and Evacuation is Performed.

First, a material, is set inside the material feeding device 10 and the inside of the reaction chamber 1, the inside of the fine particle collection section 3 and the inside of the material feeding device 10 are evacuated by the circulation pump 22, for example, to be several 10 Pa, thereby reducing the effect of oxygen in the air.

(Step S2) The Gas is Introduced and the Pressure is Regulated.

Subsequently, gases are supplied from the plural gas supply devices 27 to the material feeding device 10, the lower-side gas supply pipes 14 and the upper-side gas supply pipes 15 through the flow-rate regulator 26 while regulating flow rates of the gases. The gasses supplied from the material supply device 10, the lower-side gas supply pipes 14 and the upper-side gas supply pipes 15 into the reaction chamber 1 are regulated to be a given pressure in the reaction chamber 1 by the pressure regulating valve 21 attached in a previous stage of the pump 22 through the pipe 16, the fine particle collection section 3 and the pipe 20 connected to an upper end of the reaction chamber 1. The plurality of lower-side gas supply pipes 14 are provided to stand upward in the vertical direction in a lower part of the reaction chamber 1 so that the gas is supplied upward in the vertical direction into the reaction chamber 1. The plural upper-side gas supply pipes 15 are arranged transversely toward the center of the reaction chamber 1 between the wall 51a of the inner chamber 51 and the reaction chamber wall 13. Accordingly, the pressure in the outside space 115 of the inner chamber 51 between the wall 51a of the inner chamber 51 and the reaction chamber wall 13 becomes higher than the pressure in the inside space 116 of the inner chamber 51, and the gas is introduced into the reaction chamber 1 so that the gas is introduced to the inside space 116 from the gaps 154 between the through holes 54 for the electrode 4 in the wall 51a of the inner chamber 51 and the electrodes 4. Therefore, the gas flow-between the region where the arc discharge 31 is generated and the outside of the inner chamber 51 (in other words, between the inside and the outside of the inner chamber 51) can be also controlled.

As silicon fine particles are produced as an example in the first example in the first embodiment, the following production processes of fine particles are performed by supplying an argon gas through the two gas supply pipes 14 and 15 from the gas supply devices 27 into the reaction chamber 1 to maintain the inside of the reaction chamber 1 in a pressure in the vicinity of the atmospheric pressure under an inert gas atmosphere of argon. It is also preferable to mix a hydrogen gas and a small amount of carbonized gas with the argon gas to be introduced into the reaction chamber 1 from the gas supply devices 27 through the gas supply pipes 14 and 15 for promoting the reduction of the material.

(Step S3) Electric Discharge is Started.

The wall 51a of the inner chamber 51 is made of a carbon material as an example for suppressing the influence of heat of the arc discharge (plasma) 31. The electrodes 4 generating the arc discharge 31 are made of a carbon material as an example. As shown in FIG. 2, six electrodes 4 are radially arranged, at intervals of 60 degrees on a circumferential wall of the reaction chamber 1 in a state where tip ends of the electrodes 4 protrude in a lateral direction (for example, in an upward direction of 5 to 30 degrees with respect to the horizontal direction) in the reaction chamber 1. The electrodes 4 are cooled by water cooling and by allowing a cooling gas to flow in the electrodes 4 though not specifically shown for reducing evaporation of an electrode material.

Though n=six electrodes 4 are radially arranged in the first example, the number of electrodes may be increased as long as the numbers are multiples of 6, or the electrodes may be arranged in multiple stages of two stages, three stages, etc. in which the electrodes 4 are respectively arranged on different parallel planes, not limited to be arranged in the same plane. When the electrodes 4 are arranged in multiple stages, the generation region of the arc discharge 31 as a heat source for evaporating the material can be further expanded in the vertical direction, which is advantageous for generating a large quantity of fine particles. Electrodes made of the carbon material are used as an example of the material for the electrodes 4, however, electrodes formed of high-melting point metals such as tungsten or tantalum may be used.

As shown in FIG. 1 and FIG. 2, arbitrary two electrodes 4 are moved to the central side of the reaction chamber 1 by the electrode driving devices 4a when igniting the arc discharge 31. After the arc discharge 31 is ignited, the electrodes 4 are respectively moved in the radial directions (directions toward the outside from the central position of the radially arranged electrodes 4) by the electrode driving devices 4a under control by the controller 100 while respectively adjusting electric current applied to the electrodes 4 by the controller 100 so as to be constant based on information from ammeters (not shown) connected to the electrodes 4, so that tip ends of the electrodes 4 are positioned apart from the central position, of the electrodes 4 until the tip ends of the electrodes 4 are positioned in the vicinity of the wall 51a of the inner chamber 51. Accordingly, the area of the generation region of the arc discharge 31 as thermal plasma of, for example, approximately 10000° C. is increased and the throughput can be increased. As each electrode driving device 4a, a ball screw is rotated forward and reversey by a motor, and the electrode 4 connected to a nut member screwed to the ball screw is moved forward and backward in the axial direction as an example.

(Step S4) Feeding of the Material is Started.

Subsequently, the feeding of material particles 30 to the reaction chamber 1 is started with the gas.

As an example of the material particles 30 to be a raw material of the fine particles 32, silicon powder of approximately 16 micrometers in diameter is used and placed inside the material feeding device 10. The particles having 16 micrometers in diameter are used in the first example, however, particles with particle diameters larger than 1 micron and 100 microns or less are evaporated by thermal plasma though depending on plasma conditions, therefore, fine particles 32 with particle diameters in nanometer order can be produced by using them. When using material particles 30 with particle diameters larger than 100 micrometers, it is difficult to completely evaporate the material particles 30 and fine particles 32 to be produced may be increased in size. As the material feeding device 10, a locally fluidized powder feeding device can be used, as an example. In the locally fluidized powder feeding device, the feeding amount of the material particles 30 is controlled by the flow rate of a carrier gas and the number of rotations of a vessel, to which the material particles 30 are introduced, thereby feeding the material particles 30 as a powder material to the material feeding pipe 11 at a constant rate. As other examples of the material feeding device 10, there are a surface-copying powder feeder controlling the distance between the surface of the particle material and a nozzle by using laser, a quantitative powder feeder feeding a fixed quantity of powder material to a groove from a hopper and absorbing the material, etc. Any type of powder material feeding devices which can be properly used in accordance with the quantity of powder material to be fed can be used.
(Step S5) Fine Particles are Produced.

Next, the material particles 30 are fed from the material feeding device 10 to the material feeding pipe 11 with the gas and introduced into the reaction chamber 1 from the material supply port 12 at the upper end of the material feeding pipe 11 with the gas as shown in FIG. 1. Plural gas supply pipes 14 for feeding the material particles 30 or the fine particles 32 generated by the arc discharge 31 in a fixed direction (upward in the vertical direction) are provided around the material feeding pipe 11, and an atmospheric gas is supplied from the gas supply pipes 14 in the fixed direction (upward in the vertical direction). The material feeding pipe 11 and the material feeding port 12 are positioned in the lower side of the central position of the plural electrodes 4 in the vertical direction. In particular, the material feeding port 12 at the upper end of the material feeding pipe 11 is arranged to be positioned in a lower part than the region where the arc discharge 31 is generated.

The material particles 30 introduced into the reaction chamber 1 with the gas are evaporated or vaporized (hereinafter representatively referred to as "evaporated") when passing through the generation region of the arc discharge 31, and the material particles 30 are gasified. In this case, the wall 51a of the inner chamber 51 is provided with the outside space 115 between the wall 51a and the cooled reaction chamber wall 13, which is insulated with respect to the reaction chamber wall 13 by the plates 52 and 53, therefore, heat of plasma is not dissipated. Accordingly, input energy necessary for increasing the temperature of the material particles 30 to a boiling point or more is reduced as compared with a case where the inner chamber 51 is not provided. Moreover, the gas to be introduced into the inside space 116 of the inner chamber 51 from the gaps 154 between the through holes 54 of the electrodes 4 and the electrodes 4 is heated by the inner chamber 51 in which heat is stored, therefore, the temperature is increased just after being-introduced from the gas supply pipes 15. Accordingly, the temperature reduction in the material particles 30 and the plasma can be suppressed. Therefore, the processing efficiency is increased as compared with the case where the inner chamber 51 is not provided, and much material particles 30 can be evaporated. The cooling of the reaction chamber wall 13 may be performed by providing a flow path in which cooling water flows on the outside of the wall to thereby cool the reaction chamber wall 13 by chiller water.

A material gas formed by evaporating the material particles 30 moves upward, inside the reaction chamber 1 by an updraft due to the heat of the arc discharge 31 or the gas flow from the gas supply pipes 14 and 15. The material gas is rapidly cooled at a moment when the gas passes through the generation region of the arc discharge 31, and sphere-shaped fine particles 32 are generated. The cooling speed can be further increased by introducing the cooling gas to an upper part in the reaction chamber 1. At this time, the ring-shaped plates 52 and 53 are arranged above and below the inner chamber 51 to block the inner chamber 51, thereby suppressing the passing of the gas and the particles in the vertical direction. The gas is injected in the lateral direction toward the center in the reaction chamber 1 from the gaps 154 between the through holes 54 of the inner chamber 51 and the electrodes 4, thereby suppressing dispersion of the material particles 30 in the lateral direction and improving the efficiency in inputting materials to the plasma. Moreover, it is possible to suppress entering of the generated fine particles 32 into the outside space 115 between the wall 51a of the inner chamber 51 and the reaction chamber wall 13, therefore, collection efficiency can be also increased. Furthermore, when a space around the plasma 31 is reduced by the arrangement of the inner chamber 51, the flow of the processed fine particles 32 can be easily controlled, therefore, the gas flow from the lower part to the upper part can be controlled so that the generated fine particles 32 do not enter the generation region of the plasma 31 again by adjusting the flow rate of the gas from the lower-side gas supply pipe 14 and the upper-side gas supply pipe 15 by the flow-rate regulator 26, the heat of plasma is not used for evaporating the material again and the heat of plasma can be used for evaporation more efficiently. There is an additional effect of cooling the electrodes 4 by allowing the gas to flow in the gaps 154.

Generally, in the axe discharge 31 at a position, where the material particles 30 are supplied, the heat of plasma is taken by evaporation of the material particles 30, therefore, the temperature of the arc discharge 31 at the position where the material particles 30 are evaporated is reduced. In the case where the material particles are successively inputted into a continuous discharge such as an inductively-coupled plasma (TCP) torch in related art, the temperature of plasma is reduced due to the evaporation of the material particles 30 and the material particles 30 are not completely evaporated, therefore, fine particles with relatively large diameters are produced and the distribution of particle diameters is deteriorated. The input of the material particles 30 has to be limited for producing the fine particles 32 having a desired particle diameter or for improving the distribution of particle diameters of the produced fine particles 32, which reduces the throughput.

On the other hand, the arc discharge 31 generated by the plural electrodes 4 used in the first example, adopts the AC power sources which can supply the power phases of which differ from one another, for example, the power of 60 Hz in which the phase is shifted by, for example, 60 degrees as power sources of the plural electrodes 4, respectively. Accordingly, the power discharge has a pulse shape, and high-temperature thermal plasma can be constantly generated.

The thermal plasma such as the arc discharge 31 or the TCP torch is a viscous gas, therefore, the material particles 30 do not enter the generation region of the arc discharge 31 and are not processed if the particles 30 do not have a certain velocity. In the apparatus in which the material feeding device 10 and the material feeding port 12 are installed in the lower side of the generation region of the arc discharge 31 in the vertical direction, and the material particles 30 are fed from, the lower side of the arc discharge 31 in the vertical direction, unprocessed material particles 30 repelled by the arc discharge 31 fall to the lower side in the vertical direction due to the gravity, which can be positively separated from the processed fine particles 32 positioned in the upper part of the generation region of the arc discharge 31. These unprocessed material particles 30 are accumulated in the bottom of the reaction chamber 1. The material accumulated in the bottom of the reaction chamber 1 can be returned to the material feeding device 10 and can be used again, which can increase the material use efficiency.

(Step S6) The Discharge is Stopped and Fine Particles are Collected.

Subsequently, the fine particles 32 generated by the arc discharge 31 are collected by the fine particle collection section 3 by the flow of the gas from the gas supply pipes 14 and 15 toward the fine particle collection section 3 as shown in FIG. 1. A cyclone which can classify particles having an arbitrary particle diameter or more and a bag filter which can collect desired fine particles are installed in the fine particle collection section 3, though not shown. The bag filter for collecting fine particles 32 can use a filter formed of silica fibers having high heat resistance as an example as the high-temperature gas is circulated. As there is a danger of fire when the collected fine particles 32 are taken to the air, the fine particles 32 are left under an atmosphere containing approximately 1% air (gas containing oxygen) and taken out to the air after a gradual oxidation process is performed. Accordingly, surfaces of silicon fine particles are oxidized, for example, in a range of about 1 to 2 nanometers, therefore, they can be safely taken out. The silicon fine particles having, for example, 10 to 300 nanometers can be collected from the bag filter through the processes. As the carbon material, is used for the electrodes 4 and the wall 51a of the inner chamber 51 in the example, high-temperature plasma does not touch the reaction chamber wall 13 and the electrodes 4 which are generally formed of a metal, therefore, the generated silicon fine particles can suppress increase of impurities of the metal, etc. in the process and a content of the metal material can be suppressed to 0.5% or less. The metal material, etc, not contributing to the capacity can be suppressed when the generated silicon fine particles are used for a lithium battery, therefore, a battery capacity can be increased.

The method of producing silicon (Si) fine particles with particle diameters in nanometer order has been explained, in the first example, and fine particles may be produced by using metals such as nickel (Ni), silver (Ag) and copper (Cu) and inorganic materials such, as glass ($SiO_2$), silicon nitride (SiN) and alumina ($Al_2O_3$) as materials for producing fine particles. It is also possible to produce fine particles of, for example, silicon monoxide (SiOx:x=1 to 1.6), silicon nitride (SiNx: x=0.1 to 1.3) or silicon carbide (SiCx) by using silicon materials by causing materials to react with the gas introduced into the reaction chamber 1. The method can also be applied to generation of composite materials including plural materials which have a silicon core inside them and are covered with alumina or silicon carbide and so on in the outside.

According to the first embodiment, the inner chamber 51 is installed with the outside space 115 provided between the inner chamber 51 and the reaction chamber wall 13, thereby supplying the gas into the space 115 between the reaction chamber wall 13 of the reaction chamber 1 and the wall 51a of the inner chamber 51 and reducing the space around the plasma 31, which facilitates control of the flow of the processed fine particles 32. Accordingly, it is possible to suppress the loss in thermal plasma, and to reduce energy necessary for evaporating the material in the thermal plasma.

Furthermore, the temperature of the inner chamber 51 is increased by the heat of plasma, for example, to 100 to 1000° C., which is higher than the temperature of the reaction chamber 1, for example, the reaction chamber wall 13 which is cooled by the cooling water to be, for example, approximately 20° C. When the gas is supplied from the gas supply pipes 15 to the space between the wall 51a of the inner chamber 51 and the reaction chamber wall 13, the gas introduced into the inner chamber 51 is heated to, for example, 50 to 1000° C. by the heat of the inner chamber 51. That is, a temperature of the gas introduced into the inner chamber 51 is higher than a temperature of the gas introduced to the space between the reaction chamber wall 13 and the wall 51a of the inner chamber 51.

The gas is supplied to the space between, the wall 51a of the inner chamber 51 and the reaction chamber wall 13 from the gas supply pipes 15, and the heated gas is injected from the gaps 154 between the through holes 54 of the electrodes 4 on the wall 51a of the inner chamber 51 and the electrodes 4 to the generation region of the arc discharge 31 in the space 116 inside the inner chamber 51 and in the center of the reaction chamber 1, thereby further suppressing the reduction in the plasma temperature and suppressing reinput of the fine particles 32 to the plasma. Accordingly, the efficiency of evaporating the material particles 30 by the thermal plasma can be increased by improving a collection amount and the efficiency of energy used for processing with respect to the input power energy, as a result, a large quantity of material particles can be processed. Therefore, the production apparatus and production method for fine particles capable of increasing the production of fine particles 32 and producing fine particles 32 at low cost can be provided.

Also according to the first embodiment, the AC power sources 5 are respectively connected to the plural electrodes 4 to thereby produce the arc discharge 31, therefore, the area of thermal plasma by the arc discharge 31 for evaporating the material particles 30 (the area of the generation region of the arc discharge 31) can be increased as compared with other methods, and a large quantity of material can be processed.

The present disclosure is not limited to the above embodiments, and can be achieved in other various manners. For example, the inner chamber 51 may have various shapes such as a conical shape other than the cylindrical shape. For example, the gas supply pipes 15 may supply the gas from the vicinity of the through holes of the electrodes 4 on the wall 51a of the inner chamber 51. Accordingly, the temperature control of the gas flow can be performed more easily. Moreover, the wall 51a of the inner chamber 51 or the pipe 16 are made of a porous material and the gas is injected from surfaces of the wall 51a of the inner chamber 51 or the pipe 16, thereby suppressing adhesion of the fine particles 32 onto the surfaces. It is also possible to rapidly cool the evaporation gas by providing a hole on the wall 51a of the inner chamber 51 in the vicinity of an upper part of the plasma, through which a cooled gas is allowed to flow.

Arbitrary embodiments or modification examples in the above various embodiments and modification examples are suitably combined, thereby obtaining advantages possessed by respective examples. Embodiments can be combined with each other, examples can be combined with each other or embodiments and examples can be combined with each other, furthermore, features in different embodiments or examples can be also combined.

The production apparatus and the production method for fine particles according to the above aspects of the present disclosure can process a large quantity of materials efficiently by suppressing exhaust heat from plasma, which can increase the production quantity of fine particles and can produce fine particles at low cost. Accordingly, the present disclosure is useful as the production apparatus and the production method for fine particles used for devices in which mass production is required such as a lithium-ion secondary battery or a ceramic capacitor.

What is claimed is:

1. A production apparatus for fine particles including
a vacuum chamber,
a material feeding device connected to the vacuum chamber and configured to feed material particles from a material feeding port into the vacuum chamber,
electrodes arranged in the vacuum chamber for generating plasma in a plasma generation region in the vacuum chamber to produce the fine particles from the material supplied from the material feeding device, and
a collection device connected to the vacuum chamber and configured to collect the fine particles discharged from the vacuum chamber,
the apparatus comprising:
an inner chamber installed between a wall of the vacuum chamber and the plasma generation region, the inner chamber forming an outside space with respect to the wall of the vacuum chamber; and
gas supply pipes for supplying a gas to the outside space between the wall of the vacuum chamber and a wall of the inner chamber.

2. The production apparatus for fine particles according to claim 1,
wherein the gas is supplied to the outside space from the gas supply pipes to thereby make a pressure in the outside space of the inner chamber between the wall of the vacuum chamber and the wall of the inner chamber higher than a pressure in a space inside the inner chamber.

3. The production apparatus for fine particles according to claim 2,
wherein electrode through holes through which the electrodes can pass are provided on the wall of the inner chamber, and
the gas introduced from the gas supply pipes into the outside space between the vacuum chamber and the inner chamber is introduced into the space inside the inner chamber from gaps formed between the electrodes and the electrode through holes.

4. The production apparatus for fine particles according to claim 3,
wherein a temperature of the inner chamber is higher than a temperature of the vacuum chamber, and
a gas temperature introduced into the inner chamber is higher than a gas temperature introduced between the vacuum chamber and the inner chamber.

5. The production apparatus for fine particles according to claim 3,
wherein the electrodes for generating the plasma are a plurality of electrodes, tip ends of the plurality of electrodes protrude inside the vacuum chamber to generate plasma.

6. The production apparatus for fine particles according to claim 3,
wherein the electrodes for generating the plasma are a plurality of electrodes,
AC power sources respectively connected to the plurality of electrodes and configured to supply power in different phases are further included, and
the power in different phases is supplied to respective plural electrodes from the AC power sources to generate arc discharge and to generate the plasma.

7. The production apparatus for fine particles according to claim 3,
wherein the inner chamber is made of a carbon material.

8. The production apparatus for fine particles according to claim 3,
wherein the electrodes are made of a carbon material.

9. A method for producing fine particles comprising:
supplying a gas to a vacuum chamber and supplying the gas into an outside space between a wall of the vacuum chamber and a wall of an inner chamber which is arranged between the wall of the vacuum chamber and a plasma generation region;
generating thermal plasma in the plasma generation region in a space inside the inner chamber by electrodes installed in the vacuum chamber;
feeding material particles to the vacuum chamber to be evaporated or gasified when the fed material particles passes through the generation region of the generated thermal plasma to thereby obtain a material gas; and
cooling the material gas rapidly at a moment when the material gas passes through the region of thermal plasma to thereby generate fine particles.

10. The production method for fine particles according to claim 9,
wherein the gas supplied to the outside space is introduced into the space inside the inner chamber from gaps formed between electrode through holes provided on the wall of the inner chamber, through which the electrodes can pass, and the electrodes.

11. The production method for fine particles according to claim 10,
wherein the electrodes are a plurality of electrodes, and the thermal plasma is arc discharge obtained by respectively supplying power in different phases to the plurality of electrodes from AC power sources to be discharged in a pulse shape.

* * * * *